United States Patent
Li et al.

(10) Patent No.: US 10,727,380 B2
(45) Date of Patent: Jul. 28, 2020

(54) WAVELENGTH CONVERTING FILM AND MANUFACTURING METHOD THEREOF

(71) Applicant: PlayNitride Inc., Tainan (TW)

(72) Inventors: Yun-Li Li, Tainan (TW); Po-Jen Su, Tainan (TW); Hsuan-Wei Mai, Tainan (TW)

(73) Assignee: PlayNitride Inc., Hsinchu County (TW)

( * ) Notice: Subject to any disclaimer, the term of this patent is extended or adjusted under 35 U.S.C. 154(b) by 689 days.

(21) Appl. No.: 14/924,727

(22) Filed: Oct. 28, 2015

(65) Prior Publication Data
US 2016/0141468 A1    May 19, 2016

Related U.S. Application Data

(60) Provisional application No. 62/081,503, filed on Nov. 18, 2014, provisional application No. 62/092,265, filed on Dec. 16, 2014.

(30) Foreign Application Priority Data

May 11, 2015 (TW) ............................... 104114838 A (51) Int. Cl.
- H01L 33/50 (2010.01)
- B29C 39/02 (2006.01)
- B29L 11/00 (2006.01)

(52) U.S. Cl.
CPC .......... *H01L 33/505* (2013.01); *B29C 39/025* (2013.01); *B29K 2995/00* (2013.01); *B29K 2995/0018* (2013.01); *B29L 2011/00* (2013.01); *H01L 2933/0041* (2013.01); *H01L 2933/0091* (2013.01)

(58) Field of Classification Search
CPC ........... H01L 33/505; H01L 2933/0091; H01L 2933/0041; B29C 39/025; B29L 2011/00; B29K 2995/00; B29K 2995/0018
USPC .................................................. 427/162–169
See application file for complete search history.

(56) References Cited

U.S. PATENT DOCUMENTS

| | | | | |
|---|---|---|---|---|
| 6,040,016 | A * | 3/2000 | Mitani | B05B 7/02 427/72 |
| 2007/0013057 | A1* | 1/2007 | Mazzochette | H01L 25/0753 257/723 |
| 2010/0102251 | A1* | 4/2010 | Ferrini | G02B 5/02 250/484.4 |
| 2011/0220920 | A1* | 9/2011 | Collins | H01L 33/504 257/88 |
| 2012/0319575 | A1* | 12/2012 | Nakamura | H01L 33/505 313/512 |
| 2016/0020582 | A1* | 1/2016 | Ma | H01S 5/187 372/50.11 |

* cited by examiner

*Primary Examiner* — Michael P Wieczorek
*Assistant Examiner* — Michael G Miller
(74) *Attorney, Agent, or Firm* — JCIPRNET (57) ABSTRACT

A method for manufacturing a wavelength converting film is provided. A release film is provided. At least one coating process is performed to form at least one wavelength converting layer on the release film, wherein a first contact surface of the at least one wavelength converting layer and the release film has a first roughness. An adhesive layer is formed on a surface of the wavelength converting layer farthest from the release film, wherein a second contact surface of the adhesive layer and the wavelength converting layer has a second roughness. The second roughness is greater than the first roughness.

24 Claims, 5 Drawing Sheets

WAVELENGTH CONVERTING FILM AND MANUFACTURING METHOD THEREOF

CROSS-REFERENCE TO RELATED APPLICATION

This application claims the priority benefits of U.S. provisional application Ser. No. 62/081,503, filed on Nov. 18, 2014, U.S. provisional application Ser. No. 62/092,265, filed on Dec. 16, 2014, and Taiwan application Ser. No. 104114838, filed on May 11, 2015. The entirety of each of the above-mentioned patent applications is hereby incorporated by reference herein and made a part of this specification.

BACKGROUND OF THE INVENTION

Field of the Invention

The invention is related to a wavelength converting structure, and more particularly to a wavelength converting film and a manufacturing method thereof.

Description of Related Art

Conventionally, a packaging method of a light emitting diode chip adopts a dispensing process to make a molding compound (e.g. AB glue) to directly seal the light emitting diode chip, wherein phosphor particles are also added to the molding compound to change the light-emitting color of the light emitting diode chip. However, it is unlikely to complete a plurality of light emitting diode chip packages at a time via the dispensing process; consequently, the manufacturing time and cost inevitably increase.

In addition, the solid content of the molding compound is low. Before the solidation process is performed, the phosphor particles in the molding compound are likely to be affected by gravity to precipitate, causing non-uniform distribution of the phosphor particles in the molding compound. Consequently, the light emission and color temperature generated by the packaged light emitting diode package are non-uniform.

SUMMARY OF THE INVENTION

The invention provides a wavelength converting film and a manufacturing method thereof, which may solve the conventional problem that the phosphor particles precipitate in the molding compound and improve manufacturing efficiency of the light emitting diode device.

The invention provides a manufacturing method of a wavelength converting film, which includes the following steps, namely, providing a releasing film; performing at least one coating process and forming at least one wavelength converting layer on the releasing film, wherein a first contact surface of the at least one wavelength converting layer and the releasing film has a first roughness; forming an adhesive layer on a surface of the wavelength converting layer farthest from the releasing film, wherein a second contact surface of the adhesive layer and the wavelength converting layer has a second roughness, and the second roughness is greater than the first roughness.

In an embodiment of the invention, a thickness of each of the at least one wavelength converting layer is 1 to 3 times greater than a thickness of the adhesive layer.

In an embodiment of the invention, the at least one wavelength converting layer includes a wavelength converting substance and a glue, and at least one wavelength converting layer is calculated based on a total percentage of 100% of composition, and the weight percentage of the wavelength converting substance is 60% to 95%.

In an embodiment of the invention, the thickness of each of the at least one wavelength converting layer is between 1.2 to 3 times greater than an average particle size of the wavelength converting substance.

In an embodiment of the invention, after forming the adhesive layer, the method further includes performing a parting process to separate the releasing film from the at least one wavelength converting layer.

In an embodiment of the invention, a plurality of diffusion particles, reflective particles, scattering particles or at least two of the above are doped in the adhesive layer.

In an embodiment of the invention, the at least one wavelength converting layer includes a first wavelength converting layer and a second wavelength converting layer. The first wavelength converting layer is disposed between the releasing film and the second wavelength converting layer.

In an embodiment of the invention, a main emission peak wavelength of the first wavelength converting layer is less than a main emission peak wavelength of the second wavelength converting layer.

In an embodiment of the invention, a full width half magnitude of the second wavelength converting layer is less than a full width half magnitude of the first wavelength converting layer.

In an embodiment of the invention, a thickness of the first wavelength converting layer is greater than a thickness of the second wavelength converting layer.

In an embodiment of the invention, the at least one coating process is a spin coating process.

In an embodiment of the invention, the at least one wavelength converting layer includes a wavelength converting substance and a glue, wherein the wavelength converting substance is scattered in the glue. The at least one wavelength converting layer has a first region and a second region. The concentration of the wavelength converting substance in the first region is greater than the concentration of the wavelength converting substance in the second region, and the second region surrounds the first region.

The invention provides a manufacturing method of a wavelength converting film for carrying at least one light emitting wafer. The manufacturing method of the wavelength converting film includes the following manufacturing processes, including providing a releasing film; performing at least one coating process to form at least one wavelength converting layer on the releasing film, wherein a first contact surface of the at least one wavelength converting layer and the releasing film has a first roughness; forming an adhesive layer on a surface of the wavelength converting layer farthest from the releasing film, wherein a second contact surface of the adhesive layer and the wavelength converting layer has a second roughness, and the second roughness is greater than the first roughness, the adhesive layer is connected to the at least one light emitting wafer.

The invention provides a wavelength converting film for carrying a light emitting wafer. The wavelength converting film includes a wavelength converting layer and an adhesive layer. The wavelength converting layer has a first surface and a second surface opposite to each other, wherein the first surface has a first roughness. The adhesive layer is connected to the second surface of the wavelength converting layer and disposed between the wavelength converting layer and the light emitting wafer, wherein a contact surface of the adhesive layer and the wavelength converting layer has a second roughness, and the second roughness is greater than the first roughness.

In an embodiment of the invention, a hardness of each of the at least one wavelength converting layer ranges from 30D to 90D of Shore Durometer hardness.

Based on the above, the manufacturing method of the wavelength converting film of the invention is performed by forming the wavelength converting layer on the releasing film via the coating process, and forming the adhesive layer on the surface of the wavelength converting layer farthest from the releasing film. Therefore, compared with existing method through which the light emitting diode package is formed via the dripping process, the manufacturing method of the wavelength converting film of the invention not only has the advantage of suitable for mass-production with an easy process that can be subsequently applied to the light emitting wafer to manufacture a lot of light emitting devices at a time, but also avoids the conventional problem that the phosphor particles subside in the molding compound to achieve better products reliability. In addition, the wavelength converting layer formed via the manufacturing method of the wavelength converting film may have thinner thickness to save the cost of the wavelength converting layer.

In order to make the aforementioned features and advantages of the invention more comprehensible, embodiments accompanying figures are described in detail below.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

DESCRIPTION OF EMBODIMENTS

Figure 1A:
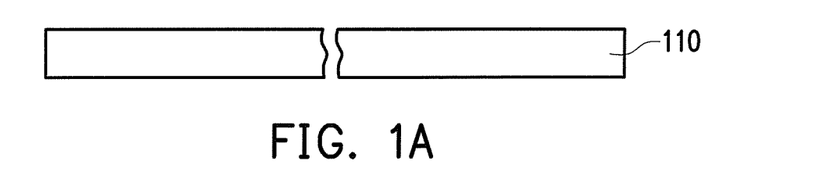
FIGS. 1A to 1C are schematic cross-sectional views illustrating partial steps of a manufacturing method of a wavelength converting film according to an embodiment of the invention.
Figure 1B:
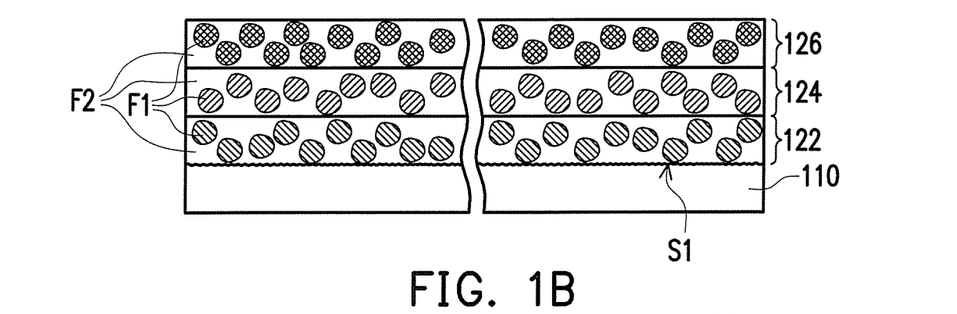
Figure 1C:
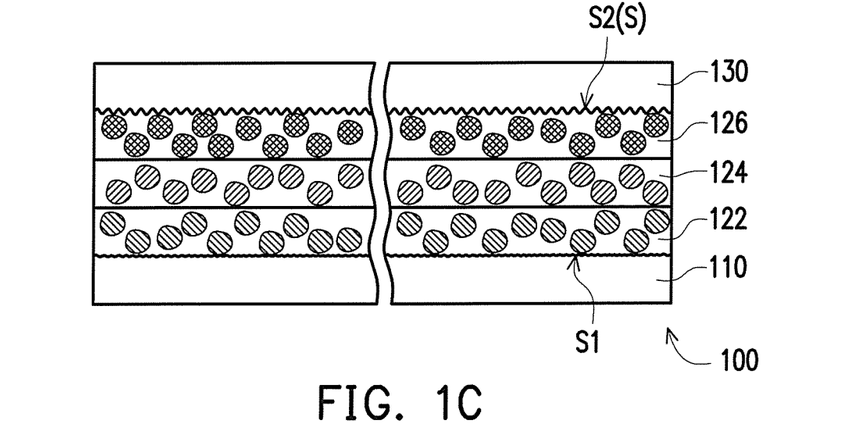

FIGS. 1A to 1C are schematic cross-sectional views illustrating partial steps of a manufacturing method of a wavelength converting film according to an embodiment of the invention. Referring to FIG. 1A at first, a releasing film 110 is provided, wherein a material of the releasing film 110 may be a transparent material such as epoxy resin, polyethylene terephthalate (PET), silicone, polyurethane, polypropylene (PP) or silicon dioxide.

Next, please refer to FIG. 1B. At least one coating process is performed to form at least one wavelength converting layer on the releasing film 110, wherein a first contact surface S1 of the at least one wavelength converting layer and the releasing film 110 has a first roughness. Here, the coating process is, for example, a blade coating process, precision coating process, pushing coating process, wire bar coating process, screen printing coating process, spin coating process, or gravure coating. A wavelength converting substance F1 is mixed with a glue F2 to obtain a wavelength converting glue (not shown). The wavelength converting glue is disposed on the releasing film 110, and the coating process is performed to form the wavelength converting glue into a uniform wavelength converting layer. At this time, the wavelength converting layer covers the releasing film 110, wherein the coating process is preferably the blade coating process or precision coating process, which may have the advantage of easy implementation.

Specifically, in the embodiment, for example, the coating process is performed for three times, forming three wavelength converting layers 122, 124 and 126 stacked in sequence, which should not be construed as a limitation to the invention, wherein the wavelength converting layer 122 is disposed between the wavelength converting layer 124 and the releasing film 110. Each wavelength converting layer 122 (or 124, 126) includes a wavelength converting substance F1 and a glue F2. The wavelength converting layer 122 (or 124, 126) is calculated based on a total percentage of 100% of composition. The weight percentage of the wavelength converting substance F1 is 60% to 95%, wherein the ratio of the wavelength converting substance F1 with higher concentration may increase the solid content of the glue F2 in the wavelength converting layer 122 (or 124, 126) and further reduce mobility of the glue F2, such that it is easier to dispose a fixed amount of glue F2 on the releasing film 110 so as to control the thickness of each wavelength converting layer 122 (or 124, 126). Preferably, the thickness of the wavelength converting layer 122 (or 124, 126) is between 1.2 to 3 times greater than the average particle size of the wavelength converting substance F1, such that the completed wavelength converting film 100 has thinner thickness and the heat generated by wavelength conversion is less likely to accumulate within the wavelength converting layer 122 (or 124, 126). Furthermore, the hardness of the wavelength converting layer 122 (or 124, 126) ranges from 30D to 90D of Shore Durometer hardness. Compared with known package materials with hardness of Shore A, the wavelength converting film 100 of the invention may have better crack resistance and reliability. In the embodiment, an extending direction of the formed wavelength converting layers 122, 124 and 126 is the same as an extending direction of the releasing film 110. In other words, the formed wavelength converting layers 122, 124 and 126 are specified as a planar structure. Preferably, the thickness of the wavelength converting layer 122 (or 124, 126) is between 15 μm to 80 μm. More preferably, the thickness of the wavelength converting layer 122 (or 124, 126) is less than 60 μm. Here, the thicknesses of the wavelength converting layers 122, 124 and 126 are shown to be the same. However, in other embodiments, the thicknesses of the wavelength converting layers 122, 124 and 126 may be different, the invention provides no limitation thereto.

Finally, please refer to FIG. 1C. An adhesive layer 130 is formed on a surface S of the wavelength converting layer 126 farthest from the releasing film 110, wherein a second contact surface S2 of the adhesive layer 130 and the wavelength converting layer 126 has a second roughness, and the second roughness is greater than the first roughness. Here, the thickness of the adhesive layer 130 is, for example, between 5 μm to 35 μm. Preferably, the thickness of the adhesive layer 130 is less than 20 μm. The adhesive layer 130 covers the surface S of the wavelength converting layer 126. In other words, the wavelength converting layers 122, 124 and 126 of the embodiment are disposed between the releasing film 110 and the adhesive layer 130. So far, the manufacturing process of the wavelength converting film 100 is completed. It should be pointed out that the purpose of disposing the releasing film 110 is to protect the surface of the wavelength converting layer 122 and enable the wavelength converting layer 122 to form a planar structure. The purpose of disposing the adhesive layer 130 is to enable the wavelength converting film 100 to be entirely adhered to the light emitting wafer (not shown) to enhance application of the wavelength converting film 100. Specifically, the adhesive layer 130 may be formed using the coating process for forming the wavelength converting layers 122, 124 and 126 such that the thickness of each wavelength converting layer 122, 124 and 126 is about the same as the thickness of the adhesive layer 130. Preferably, the thickness of each wavelength converting layer 122, 124 and 126 is 1 to 3 times greater than the thickness of the adhesive layer 130 such that the wavelength converting film 100 has more uniform thickness and smaller size.

In the embodiment, the fabrication of the wavelength converting film 100 is performed by forming the wavelength converting layers 122, 124 and 126 on the releasing film 110 via the coating process, and the adhesive layer 130 is formed on the surface S of the wavelength converting layer 126 farthest from the releasing film 110. Therefore, compared with known method that forms the molding compound for sealing the light emitting diode through dripping process, the manufacturing method of the wavelength converting film 100 of the embodiment not only provides easy manufacturing process suitable for mass-production, but also avoids the conventional problem that the phosphor particles subside in the molding compound so as to achieve better product reliability. Furthermore, in subsequent application, the wavelength converting film 100 may be directly adhered to the light emitting wafer (not shown) via the adhesive layer 130 to complete fabrication of a plurality of light emitting devices (not show) at a time, making it is easier to use. In addition, the wavelength converting layers 122, 124 and 126 formed using the manufacturing method of the wavelength converting film 100 are specified as a planar structure, such that the wavelength converting film 100 may have thinner thickness with a smaller size on the light emitting device (not shown) and save more cost of the wavelength converting film.

In the meantime, the wavelength converting layers 122, 124 and 126 of the embodiment have the advantages of thin shape (1.2 to 3 times greater than the average particle size of the wavelength converting substance F1), high concentration (the weight percentage of the wavelength converting substance F1 is 60% to 95%) and high hardness (30D to 90D of Shore Durometer hardness), such that the wavelength converting film 100 of the embodiment may achieve the effect of being compact while providing protection for the element to be adhered to (e.g. light emitting device, not shown). Moreover, since the releasing film 110 of the embodiment is flat and smooth, when forming the wavelength converting layer 122 on the releasing film 110 during the coating process, the glue F2 of the wavelength converting layer 122 fills the gap between the wavelength converting substance F1 and the releasing film 110 to the full, the roughness of the first contact surface S1 of the wavelength converting layer 122 and the releasing film 110 is low. In the meantime, the particle of the wavelength converting substance F1 in the wavelength converting layer 126 is large (e.g. between 15 to 30 μm) and has high concentration, and therefore the roughness of the surface S of the wavelength converting layer 126 is higher and the adhesion to the adhesive layer 130 is greater. Consequently, the second roughness of the second contact surface S2 of the wavelength converting layer 126 and the adhesive layer 130 is greater than the first roughness of the first contact surface S1 of the wavelength converting layer 122 and the releasing film 110. Since the second roughness is greater than the first roughness, when being adhered to the light emitting wafer (not shown) via the adhesive layer 130 in the subsequent application, the light may easily enter the wavelength converting layers 122, 124 and 126 from the adhesive layer 130 such that the light is sufficiently wavelength-converted in the wavelength converting layers 122, 124 and 126 to be emitted.

It should be noted that the following embodiments have adopted component notations and part of the contents from the previous embodiment, wherein the same notations are used for representing the same or similar components, and descriptions of the same technical contents are omitted. The descriptions regarding to the omitted part may be referred to the previous embodiment, and thus is not repeated herein.

Figure 1D:
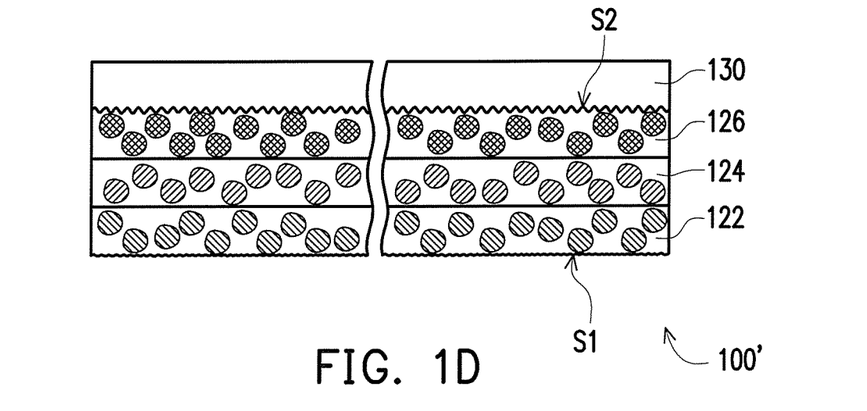
FIG. 1D is a schematic cross-sectional view illustrating a wavelength converting film according to an embodiment of the invention.

FIG. 1D is a sectional schematic view illustrating a wavelength converting film according to an embodiment of the invention. In the embodiment, a wavelength converting film 100' is similar to the wavelength converting film 100 shown by FIG. 1C. The main difference lies in that, after forming the adhesive layer 130 in the embodiment, the method further includes performing a parting process to separate the releasing film 110 from the wavelength converting layers 122, 124 and 126 to form the wavelength converting film 100' without the releasing film 110.

Figure 2:
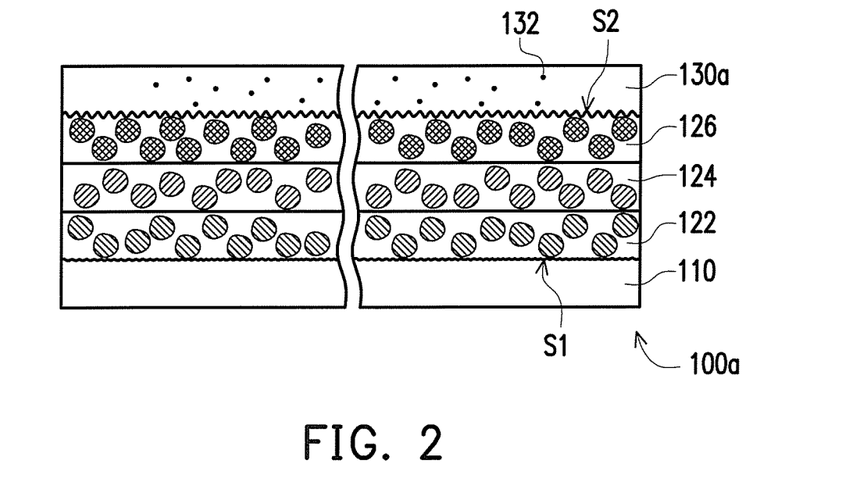
FIG. 2 is a schematic cross-sectional view illustrating a wavelength converting film according to another embodiment of the invention.

FIG. 2 is a sectional view illustrating a wavelength converting film according to another embodiment of the invention. Please refer to FIGS. 1C and 2. A wavelength converting film 100a of the embodiment is similar to the wavelength converting film 100 shown by FIG. 1C. The main difference lies in that a plurality of diffusion particles 132 are doped in an adhesive layer 130a of the wavelength converting film 100a of the embodiment. When the wavelength converting film 100a is adhered to the light emitting wafer (not shown) in the subsequent process, the light generated by the light emitting device (not shown) may have a scattering effect, which helps to improve the overall light emitting efficiency of the product. It should be pointed out that, apart from the diffusion particles, reflective particles (not shown), scattering particles (not shown) or at least two of the above may be doped in the adhesive layer 130a, such that the light generated by the light emitting device has a scattering, reflective and diffusion effect, which still belongs to a scope sought to be protected by the invention.

Figure 3:
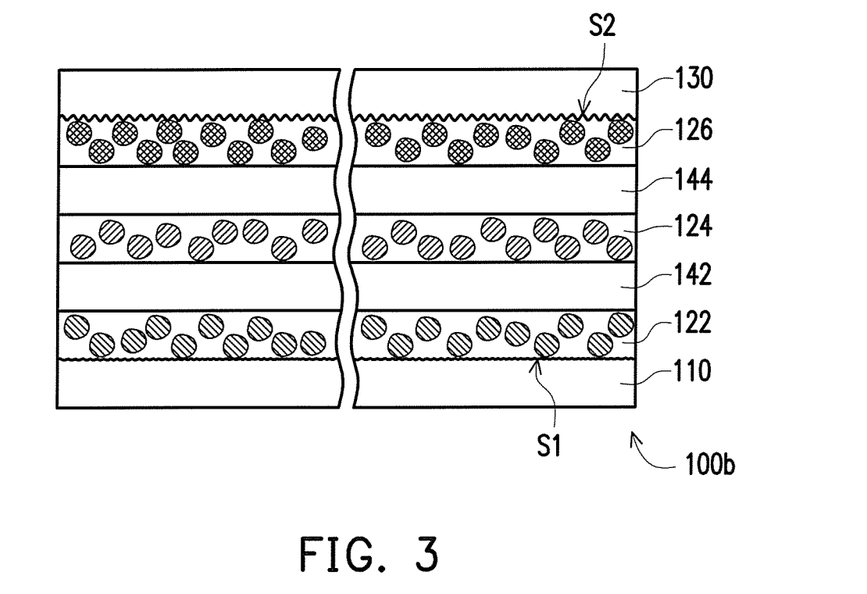
FIG. 3 is a schematic cross-sectional view illustrating a wavelength converting film according to another embodiment of the invention.

FIG. 3 is a sectional view illustrating a wavelength converting film according to another embodiment of the invention. Please refer to FIGS. 1C and 3. A wavelength converting film 100b of the embodiment is similar to the wavelength converting film 100 shown by FIG. 1C. The main difference lies in that, during the manufacturing process of the wavelength converting film 100b of the embodiment, between any two coating processes, the method further includes forming an adhesive layer on the wavelength converting layer formed in the former coating process. In other words, an adhesive layer 142 is formed after the wavelength converting layer 122 and before the wavelength converting layer 124. In the meantime, the adhesive layer 144 is formed after the wavelength converting layer 124 and before the wavelength converting layer 126. Here, the purpose of forming the adhesive layers 142 and 144 is to increase adhesion between the wavelength converting layer 122 and the wavelength converting layer 124 as well as the wavelength converting layer 124 and the wavelength converting layer 126, and also to adjust the surface tension thereof, such that the wavelength converting layers 122, 124 and 126 have a surface planarizing effect after the adhesive layer 142 is stacked therebetween and the surface roughness is less than 5 µm. Certainly, the diffusion particles (not shown), reflective particles (not shown), the scattering particles (not shown) or at least two of the above may be doped in the adhesive layers 142 and 144, such that the light generated by the light emitting device has a scattering, reflective and diffusion effect when the wavelength converting film 100b is adhered to the light emitting device (not shown) in the subsequent process, which still belongs to the scope to be protected by the invention.

Figure 4:
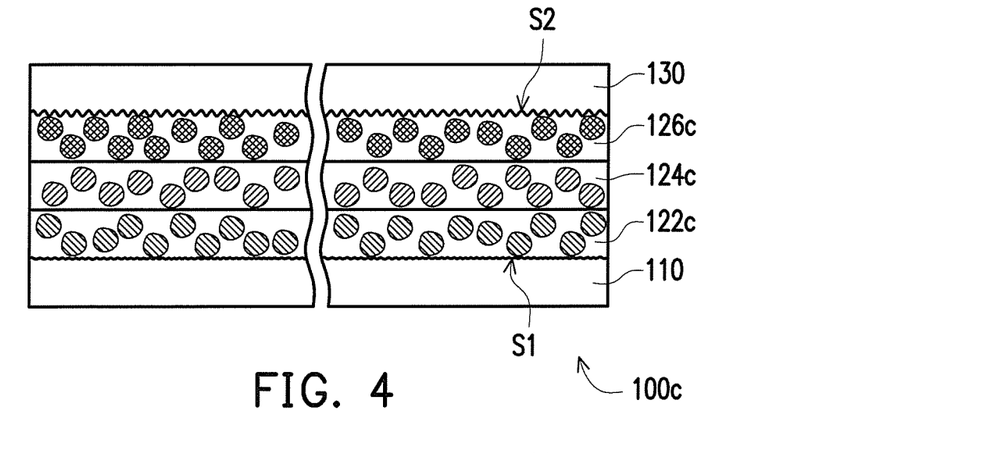
FIG. 4 is a schematic cross-sectional view illustrating a wavelength converting film according to another embodiment of the invention.

FIG. 4 is a sectional view illustrating a wavelength converting film according to another embodiment of the invention. Please refer to FIGS. 4 and 1C. A wavelength converting film 100c of the embodiment is similar to the wavelength converting film 100 shown by FIG. 1C. The main difference lies in that the main emission peak wavelength of a first wavelength converting layer 122c is less than the main emission peak wavelength of a second wavelength converting layer 124c. For example, the main emission peak wavelength of the wavelength converting layer 124c may be greater than the main emission peak wavelength of the wavelength converting layer 122c, and the main emission peak wavelength of a wavelength converting layer 126c may be greater than the main emission peak wavelength of the wavelength converting layer 124c. Such arrangement may bring the effect that the light converted by the wavelength converting layer 126c having longer main emission peak wavelength is not absorbed by the wavelength converting layers 124c and 122c having shorter main emission peak wavelength and so forth. To be more specific, the wavelength converting layer 126c may be a red wavelength converting layer; the wavelength converting layer 124c may be a yellow wavelength converting layer; and the wavelength converting layer 122c may be a green wavelength converting layer.

Certainly, in other embodiments, the main emission peak wavelength of the wavelength converting layers 122c, 124c and 126c may gradually decrease toward a direction away from the releasing film 110. For example, the main emission peak wavelength of the wavelength converting layer 122c is greater than the main emission peak wavelength of the wavelength converting layer 124c, and the main emission peak wavelength of the wavelength converting layer 124c is greater than the main emission peak wavelength of the wavelength converting layer 126c. The user may arrange the sequence of the wavelength converting layers 122c, 124c and 126c at his/her discretion depending on the type of the light emitting wafer to be adopted.

It should be pointed out that the wavelength converting films 100, 100', 100a, and 100b are described as having three wavelength converting layers 122, 124 and 126 as an example. However, in other embodiments that are not shown, the wavelength converting film may have one wavelength converting layer only, or two wavelength converting layers, or more than three wavelength converting layers, which still belongs to the scope to be protected by the invention.

Figure 5:
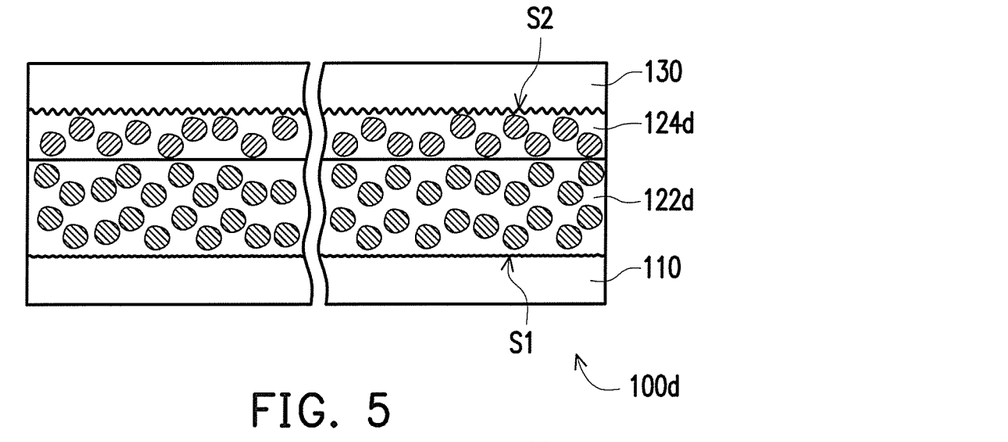
FIG. 5 is a schematic cross-sectional view illustrating a wavelength converting film according to another embodiment of the invention.

FIG. 5 is a sectional view illustrating a wavelength converting film according to another embodiment of the invention. Please refer to FIGS. 5 and 1C. In the embodiment, a wavelength converting film 100d is similar to the wavelength converting film 100 shown by FIG. 1C. The main difference lies in that the wavelength converting layer of the embodiment has two layers only, namely, a first wavelength converting layer 122d and a second wavelength converting layer 124d; meanwhile, the thicknesses of the wavelength converting layers 122d and 124d are different. Preferably, the thicknesses of the wavelength converting layers 122d and 124d gradually decrease toward a direction away from the releasing film 110. In other words, the thickness of the first wavelength converting layer 122d is greater than the thickness of the second wavelength converting layer 124d. For example, under the condition where the wavelength converting layer 124d is a red wavelength converting layer and the wavelength converting layer 122d is a green wavelength converting layer, the thickness of the wavelength converting layer 124d may be 0.2 to 0.4 times the thickness of the wavelength converting layer 122d, such that the amount of red phosphor powder which costs more may be reduced and the overall manufacturing cost of the wavelength converting layer 100d may be effectively reduced.

Figure 6:
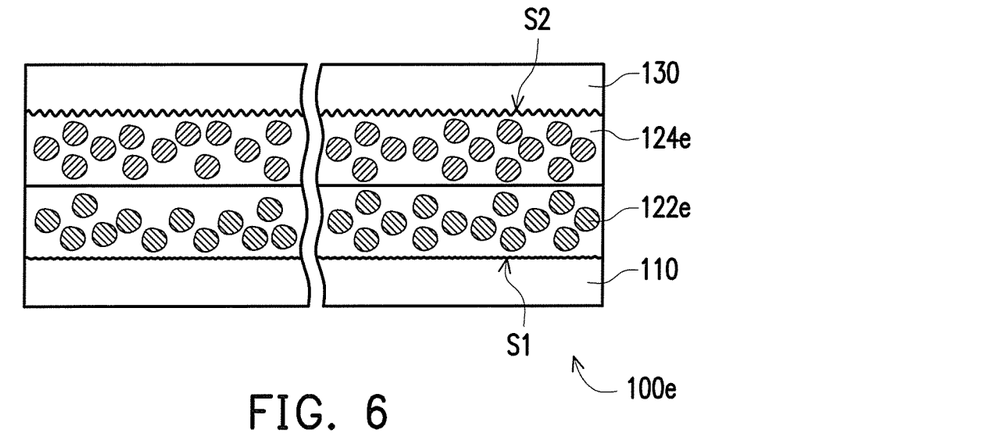
FIG. 6 is a schematic cross-sectional view illustrating a wavelength converting film according to another embodiment of the invention.

FIG. 6 is a sectional view illustrating a wavelength converting film according to another embodiment of the invention. Please refer to FIGS. 6 and 1C. In the embodiment, a wavelength converting film 100e is similar to the wavelength converting film 100 shown by FIG. 1C. The main difference lies in that the wavelength converting layer of the embodiment has two layers only, namely, a first wavelength converting layer 122e and a second wavelength converting layer 124e; meanwhile, the full width half magnitude of the wavelength converting layer 122e is different from the full width half magnitude of the wavelength converting layer 124e. Preferably, the full width half magnitude of the second wavelength converting layer 124e is less than the full width half magnitude of the first wavelength converting layer 122e, whereby avoiding that the emission light wavelength of the wavelength converting layer 122e covers an absorption spectrum of the wavelength converting layer 124e, such that a color rendering performance with wider spectrum may be provided. To be more specific, the wavelength converting layer 124e may be a red wavelength converting layer, and the wavelength converting layer 122e may be a green wavelength converting layer. The full width half magnitude of the red wavelength converting layer is less than the full width half magnitude of the green wavelength converting layer.

Figure 7:
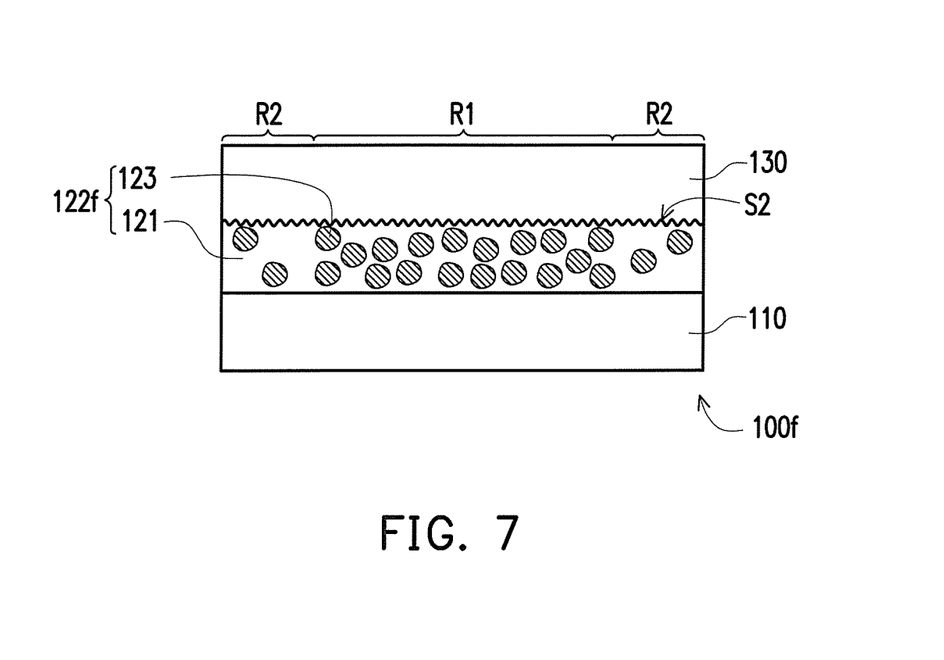
FIG. 7 is a schematic cross-sectional view illustrating a wavelength converting film according to another embodiment of the invention.

FIG. 7 is a sectional view illustrating a wavelength converting film according to another embodiment of the invention. Please refer to FIGS. 7 and 1C. In the embodiment, a wavelength converting film 100f is similar to the wavelength converting film 100 shown by FIG. 1C. The main difference lies in that a wavelength converting layer 122f of the embodiment has one layer only, wherein the wavelength converting layer 122f includes a glue 121 and a wavelength converting substance 123. Specifically, the wavelength converting substance 123 is scattered in the glue 121, and the wavelength converting layer 122f has a first region R1 and a second region R2, wherein a concentration of the wavelength converting substance 123 in the first region R1 is greater than a concentration of the wavelength converting substance 123 in the second region R2, and the second region R2 surrounds the first region R1.

In terms of the process, the manufacturing method of the wavelength converting film 100 of the embodiment is the same as the manufacturing method of the wavelength converting film 100 shown by FIGS. 1A to 1C. The only difference lies in that the coating process of the embodiment is a spin coating process. To be more specific, with the spin coating process of the embodiment, the centrifugal force and the viscosity of the glue 121 are in cooperation to generate the first region R1 and the second region R2 having different concentration of the wavelength converting substance 123. In the subsequent application of the wavelength converting film 100f, a light emitting wafer (not shown) with forward-direction light emission may be incorporated to increase light emission and color temperature uniformity of the product.

Figure 8A:
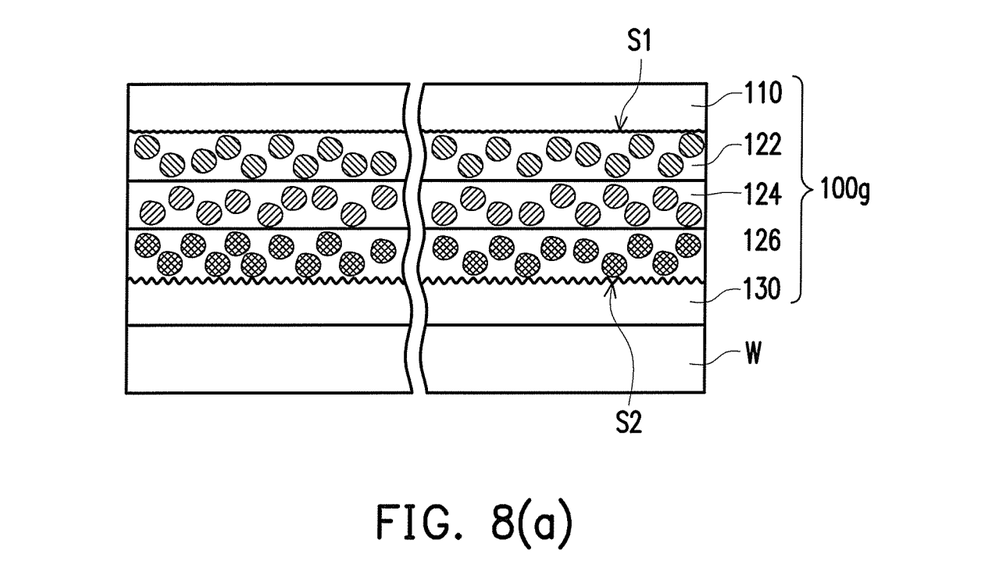
FIG. 8(a) is a schematic cross-sectional view illustrating a wavelength converting film for carrying a light emitting wafer according to an embodiment of the invention.
Figure 8B:
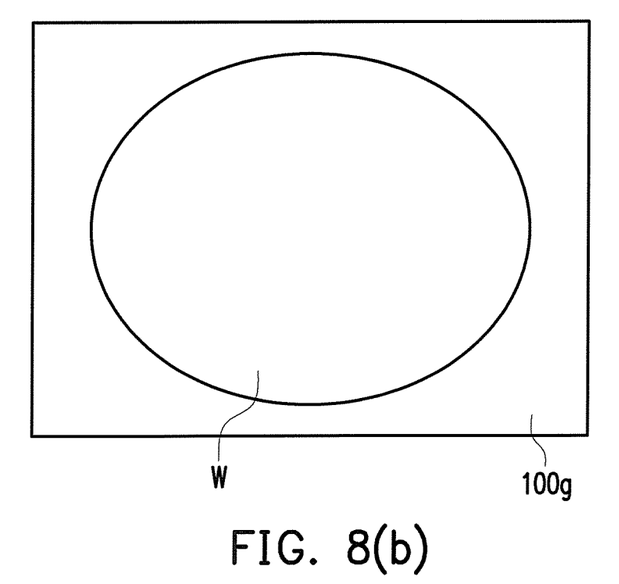
FIG. 8(b) is a schematic top view illustrating a wavelength converting film for carrying a light emitting wafer according to an embodiment of the invention.
Figure 8C:
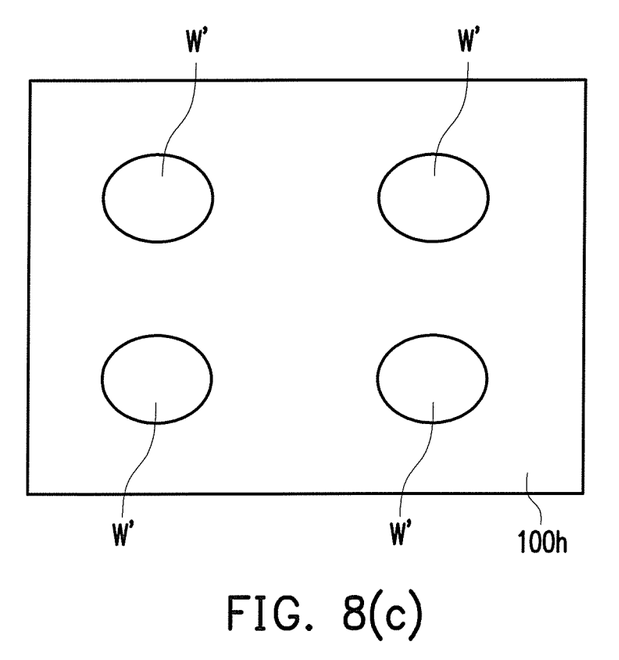
FIG. 8(c) is a schematic top view illustrating a wavelength converting film for carrying a plurality of light emitting wafers according to another embodiment of the invention.

FIGS. 8(a) to 8(c) are sectional views illustrating a wavelength converting film for carrying a light emitting wafer according to an embodiment of the invention. For ease of descriptions, FIG. 8(a) is a schematic cross-sectional view, and FIGS. 8(b) and 8(c) are top views. Please refer to FIG. 8(a) and FIG. 8(b) first. In the embodiment, a manufacturing method of a wavelength converting film 100g is the same as the manufacturing method of the wavelength converting film 100 shown by FIGS. 1A to 1C. The difference lies in that, in the embodiment, the wavelength converting film 100g is used for carrying at least one light emitting wafer W (FIG. 8(a) shows one light emitting wafer only as an example). Specifically, the adhesive layer 130 of the embodiment is connected to the light emitting wafer W, and the adhesive layer 130 is disposed between the wavelength converting layer 126 and the light emitting wafer W. The size (e.g. surface area) of the wavelength converting film 100g of the embodiment is greater than the size (e.g. surface area) of the light emitting wafer W. Therefore, the wavelength converting film 100g is adhered to the light emitting wafer W via the adhesive layer 130. Such process does not require element alignment and provides better efficiency. In addition, when the parting process is performed subsequently to separate the releasing film 110 from the wavelength converting layer 122, the color temperature of the element is not affected due to dislocation of the wavelength converting layer. Specifically, the size (e.g. surface area) of the wavelength converting film 100g of the embodiment may be greater than the size (e.g. surface area) of a plurality of light emitting wafer W. Accordingly, as shown by FIG. 8(c), a wavelength converting film 100h can be adhered to a plurality of light emitting wafers W' at the same, making it easier to use and assemble and providing better efficiency.

It should be pointed out that, in the above embodiments, the size (e.g. surface area) of the wavelength converting films 100g and 100h is substantially slightly greater than the size (e.g. surface area) of the light emitting wafers W and W'. Therefore, the wavelength converting films 100g and 100h may be directly adhered to the light emitting wafers W and W' via the adhesive layer 130 without being cut, making it easier to use and assemble.

Based on the above, in the invention, the manufacturing method of the wavelength converting film is performed by forming the wavelength converting layer on the releasing film via the coating process, and the adhesive layer is formed on the surface of the wavelength converting layer farthest from the releasing film. Therefore, compared with existing method through which the light emitting diode package is formed via the dripping process, the manufacturing method of the wavelength converting film of the invention not only has the advantage of being suitable for mass-production with an easy process, but also avoids the conventional problem that the phosphor particles subside in the molding compound to achieve better products reliability. In addition, the wavelength converting layer formed via the manufacturing method of the wavelength converting film may have thinner thickness. Furthermore, in subsequent application, the wavelength converting film may be directly adhered to the light emitting wafer via the adhesive layer, making it easier to use.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims and their equivalents.

What is claimed is:

1. A manufacturing method of a wavelength converting film for carrying at least one light emitting device, the manufacturing method of the wavelength converting film comprising:

providing a releasing film;

mixing a wavelength converting substance with a glue to obtain a wavelength converting glue, wherein the wavelength converting glue is disposed on the releasing film;

performing a plurality of blade coating processes to form a plurality of wavelength converting layers stacked in a planar structure on the releasing film, so that a surface roughness between the plurality of wavelength converting layers stacked in the planar structure is less than or equal to 5 microns, wherein a first contact surface of the at least one wavelength converting layer and the releasing film has a first roughness;

forming an adhesive layer using the blade coating process on a surface of the wavelength converting layer farthest from the releasing film, wherein a second contact surface of the adhesive layer and the wavelength converting layer has a second roughness, and the second roughness is greater than the first roughness, wherein a surface of the adhesive layer which is opposite to the second contact surface of the adhesive layer has a third roughness, and the second roughness is greater than the third roughness; and performing a parting process to separate the releasing film and the at least one wavelength converting layer from the first contact surface.

2. The manufacturing method of the wavelength converting film according to claim 1, wherein a thickness of each of the at least one wavelength converting layer is 1 to 3 times a thickness of the adhesive layer.

3. The manufacturing method of the wavelength converting film according to claim 1, wherein the at least one wavelength converting layer comprises a wavelength converting substance and a glue, the at least one wavelength converting layer is calculated based on a total percentage of 100% of composition, a weight percentage of the wavelength converting substance is 60% to 95%.

4. The manufacturing method of the wavelength converting film according to claim 3, wherein a thickness of each of the at least one wavelength converting layer is between 1.2 to 3 times an average particle size of the wavelength converting substance.

5. The manufacturing method of the wavelength converting film according to claim 1, wherein a plurality of diffusion particles, reflective particles, scattering particles or at least two of the above are doped in the adhesive layer.

6. The manufacturing method of the wavelength converting film according to claim 1, wherein the at least one wavelength converting layer comprises a first wavelength converting layer and a second wavelength converting layer, the first wavelength converting layer is disposed between the releasing film and the second wavelength converting layer.

7. The manufacturing method of the wavelength converting film according to claim 6, wherein a main emission peak wavelength of the first wavelength converting layer is less than a main emission peak wavelength of the second wavelength converting layer.

8. The manufacturing method of the wavelength converting film according to claim 6, wherein a full width half magnitude of the second wavelength converting layer is less than a full width half magnitude of the first wavelength converting layer.

9. The manufacturing method of the wavelength converting film according to claim 6, wherein a thickness of the first wavelength converting layer is greater than a thickness of the second wavelength converting layer.

10. The manufacturing method of the wavelength converting film according to claim 6, wherein a thicknesses of the at least one wavelength converting layers gradually decrease toward a direction away from the releasing film.

11. The manufacturing method of the wavelength converting film according to claim 1, wherein the at least one coating process is a spin coating process.

12. The manufacturing method of the wavelength converting film according to claim 11, wherein the at least one wavelength converting layer comprises a wavelength converting substance and a glue, the wavelength converting substance is scattered in the glue, and the at least one wavelength converting layer has a first region and a second region, a concentration of the wavelength converting substance in the first region is greater than a concentration of the wavelength converting substance in the second region, and the second region surrounds the first region.

13. The manufacturing method of the wavelength converting film according to claim 1, wherein a hardness of the at least one wavelength converting layer ranges from 30D to 90D of Shore Durometer hardness.

14. The manufacturing method of the wavelength converting film according to claim 1, wherein between any two of the at least one coating process, forming the adhesive layer on the at least one wavelength converting layer formed in the former of the at least one coating process.

15. The manufacturing method of the wavelength converting film according to claim 14, wherein a surface roughness of the at least one wavelength converting layer formed in the former of the at least one coating process after forming the adhesive layer is less than 5 μm.

16. The manufacturing method of the wavelength converting film according to claim 1, wherein after the wavelength converting film is attached to the at least one light emitting device, the parting process is performed to separate the releasing film and the at least one wavelength converting layer from the first contact surface.

17. A manufacturing method of a wavelength converting film for carrying at least one light emitting wafer, the manufacturing method of the wavelength converting film comprising:
providing a releasing film;
performing at least one coating process to form at least one wavelength converting layer on the releasing film, wherein a first contact surface of the at least one wavelength converting layer and the releasing film has a first roughness;
forming an adhesive layer on a surface of the wavelength converting layer farthest from the releasing film, wherein a second contact surface of the adhesive layer and the wavelength converting layer has a second roughness, and the second roughness is greater than the first roughness, the adhesive layer is connected to the at least one light emitting wafer;
making a side of the adhesive layer opposite to the second contact surface directly contact a surface of each of the at least one light emitting wafer at a time; and
separating the releasing film and the at least one wavelength converting layer from the first contact surface after making the side of the adhesive layer directly contact the surface of the each of the at least one light emitting wafer at the time to complete fabrication of a plurality of light emitting devices of each of the at least one light emitting wafer at a time.

18. The manufacturing method of the wavelength converting film according to claim 17, wherein between any two of the at least one coating process, forming the adhesive layer on the at least one wavelength converting layer formed in the former of the at least one coating process.

19. The manufacturing method of the wavelength converting film according to claim 18, wherein a surface roughness of the at least one wavelength converting layer formed in the former of the at least one coating process after forming the adhesive layer is less than 5 μm.

20. The manufacturing method of the wavelength converting film according to claim 17, wherein a size of the at least one wavelength converting film is greater than a size of the at least one light emitting wafer.

21. The manufacturing method of the wavelength converting film according to claim 17, wherein the at least one wavelength converting film is adhered to a plurality of the at least one light emitting wafer at the same time.

22. The manufacturing method of the wavelength converting film according to claim 21, wherein a spacing is between any two of the at least one light emitting wafer.

23. The manufacturing method of the wavelength converting film according to claim 20, wherein a top view shape of the at least one wavelength converting film is different from the at least one light emitting wafer.

24. The manufacturing method of the wavelength converting film according to claim 17, wherein a surface of the adhesive layer which is opposite to the second contact surface of the adhesive layer has a third roughness, and the second roughness is greater than the third roughness, and the wafer adhered to the surface of the adhesive layer.

\* \* \* \* \*